Nov. 26, 1968 R. L. DAVIES 3,413,527

CONDUCTIVE ELECTRODE FOR REDUCING THE ELECTRIC FIELD IN THE REGION OF THE JUNCTION OF A JUNCTION SEMICONDUCTOR DEVICE

Filed Oct. 2, 1964 2 Sheets-Sheet 1

INVENTOR
ROBERT L. DAVIES,

BY Urban H. Faubion

HIS ATTORNEY.

Nov. 26, 1968 R. L. DAVIES 3,413,527

CONDUCTIVE ELECTRODE FOR REDUCING THE ELECTRIC FIELD IN THE REGION OF THE JUNCTION OF A JUNCTION SEMICONDUCTOR DEVICE

Filed Oct. 2, 1964 2 Sheets-Sheet 2

INVENTOR:
ROBERT L. DAVIES,

BY Urban H. Faubion

HIS ATTORNEY.

3,413,527
CONDUCTIVE ELECTRODE FOR REDUCING THE ELECTRIC FIELD IN THE REGION OF THE JUNCTION OF A JUNCTION SEMICONDUCTOR DEVICE

Robert L. Davies, Auburn, N.Y., assignor to General Electric Company, a corporation of New York Filed Oct. 2, 1964, Ser. No. 401,091
8 Claims. (Cl. 317—234)

ABSTRACT OF THE DISCLOSURE

The peak electric field (voltage gradient) is reduced (spread) in the region of a junction of a semiconductor junction type device under conditions when the junction is reverse biased by providing a conductive electrode in close proximity to the junction region but insulated therefrom.

Figure 1:
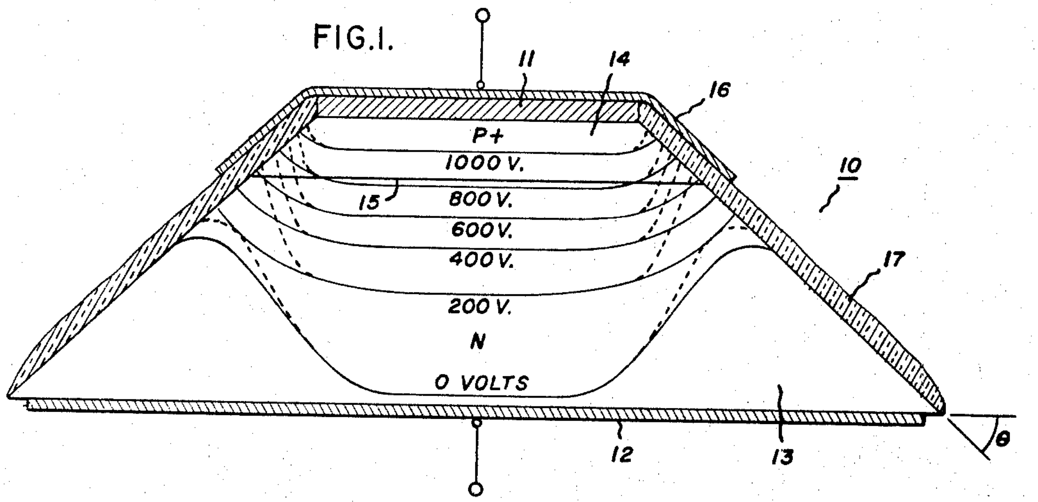

This invention relates to a means for improving the characteristics of semiconductor materials which have at least one internal junction between two zones of different conduction characteristics and the characteristics of devices which utilize such materials. More specifically, the invention is directed toward means for increasing the reverse or inverse voltage which may be applied to such devices without a breakdown and to increase the ability of such devices to dissipate power when the device does break down in the reverse direction. Reverse, or inverse, voltage as used here is a voltage which is of a polarity that would normally cause conduction to take place across a given junction in the direction of high impedance.

A junction between zones of a semiconductor material having opposite type conduction characteristics provides a low resistance path to an electric current flowing across the junction in one direction, and a high resistance path to current flow in the opposite direction. A voltage which is of such a polarity as to force a current across the junction in the direction of higher resistance is the inverse voltage referred to above. When an inverse voltage is applied across the junction between zones of semiconductor material having an excess of free electrons (N type conduction characteristics) and an excess of positive holes (P or positive conduction characteristics) respectively, the region surrounding the junction becomes deficient of free electrons and positive holes (known as carriers). The reason that this happens is that when a positive voltage is applied at the negative type conduction zone and a negative voltage applied at the positive type conduction zone, the positive carriers are attracted to the negative voltage terminal and the negative carriers are attracted to the positive voltage terminal. Thus, the carriers on both sides of the junction are attracted away from the junction to form a region (called the depletion region). The depletion region is a dielectric because of the deficiency of carriers of either type.

The dielectric depletion region is highly resistive and is capable of withholding high voltages. For example, in most practical devices, the dielectric depletion region is capable of withstanding a reverse voltage of several hundred volts without breaking down through the bulk of the material. However, most devices are not capable of withstanding more than a relatively small fraction of the voltage which the bulk will hold in the reverse direction (either transient or steady state) due to the fact that breakdown first occurs across or around the surface. For this reason, it is said that most such devices are surface limited.

The fact that most rectifiers are surface limited places severe limitations on the usefulness of the devices. To begin with, it means that the device cannot be used in circuits where reverse voltages (either steady state or transient) of over a few hundred volts are likely to occur without taking special precautions (frequently elaborate) to prevent application of the reverse voltage directly across the device.

As serious as this drawback appears, it is perhaps not as serious as other disadvantages which occur because such devices are surface limited; viz, device instability, and destruction of the device upon surface breakdown in the reverse direction.

Device instability is most frequently due to the fact that the condition of the semiconductor surface changes. The characteristics of such devices vary considerably with the condition of the surface. Therefore, unless some precautions are taken to assure that the surface condition will not change appreciably during the use of the device, the device stability is very poor. Actually it is much more difficult to control condition of the surface of the material than it is to control the characteristics of the bulk and it is certainly more difficult to control or prevent changes in surface condition than to control the essentially constant bulk characteristics. The fact of the matter is that even with elaborate precautions such as utilizing various kinds of surface treatment and placing the semiconductor material in an evacuated hermetically sealed container, the predominant failure mechanism of rectifier devices during operation is a result of surface degradation.

As to the point concerning device destruction, it is a well recognized fact that typical rectifiers (which are surface limited devices) may be permanently damaged or destroyed by only a few watts of power absorbed during breakdown, as from a very brief voltage transient, in the reverse or blocking direction. The fact that the bulk material can dissipate a great deal of energy is readily apparent by taking as an example a typical silicon rectifier and considering that such devices can, at least momentarily, dissipate 1000 watts of heat in the forward direction of current flow without any damage whatsoever. This apparent anamoly can be explained by considering the fact that for conduction in the forward direction, current and its attendant heat losses spread out equally over the entire rectifier cooling mechanism and its thermal capacity. However, in the reverse direction, the rectifier surface current under momentary high blocking voltage peaks finds some microscopic flaw or weakness at which to concentrate. Such weak spots usually occur at the junction surface where the rectifying junction emerges from the silicon pellet. At these minute spots, a fraction of a watt of concentrated heat may be sufficient to melt and destroy the blocking properties of the rectifier, regardless of size of the rectifier. The inverse voltage problem is so critical that transient rating in the reverse direction is done on the basis of voltage rather than energy.

When failure due to reverse voltage applied to the rectifier takes place through the bulk of the material instead of over the surface, the device can dissipate approximately as much energy, both steady state and transient, in its reverse direction as in its forward direction. When the device breaks down through the bulk and current flows in the reverse direction, the breakdown is called "avalanche breakdown" (sometimes mistakenly called "Zener breakdown"). Avalanche breakdown of a silicon rectifier diode is an inherent non-destructive characteristic that is widely used at relatively low power and voltage levels as a constant voltage reference and regulator in so called "Zener" diodes. Like a Zener diode, a rectifier operated within its thermal limitations maintains substantially constant voltage across it in the avalanche region regardless of current in this region. As long as the current is limited by the external circuit to the thermal capability of the device, no damage results from true avalanche action. Hence, a device with uniform avalanche breakdown occuring at a voltage below that at which local dielectric surface breakdowns occur, can dissipate hundreds of times more reverse energy with transient over-voltage conditions than one where the converse is true.

Perhaps it is well to point out that breakdown is likely to occur at the surface of the semiconductor material because of the high voltage gradient at the surface of the device. Stated in another way, breakdown occurs at the surface due to high concentration of electric fields at the surface. As a practical matter, the place where the electric field is usually of the highest intensity is in the vicinity of the junction between the two zones of opposite conduction type characteristics. For example, the transition region or junction between the two different conduction zones may be on the order of $10^{-3}$ centimeters in thickness. Thus, it is readily seen that a very strong electric field (high electric field intensity) occurs at a surface area of the body intercepted by the junction.

With these facts in mind, the objects of the present invention can be fully appreciated. For example, it is an object of the present invention to provide a semiconductor device wherein breakdown due to reverse voltage occurs within the bulk of the material of the semiconductor material instead of at the surface. Another object of the invention is to provide a semiconductor device capable of wide application without the necessity of providing protective devices which prevent high reverse voltages. Still another object of the invention is to provide a semiconductor device with surface stability problems largely eliminated.

An approach which has met many of these objects has been to provide a semiconductor pellet with a central region in which carrier multiplication through avalanche breakdown occurs initially and another outer surrounding region which, in effect, controls or determines the effect of surface conditions on the device. In general, such approaches have resulted in lowering the voltage at which the one portion of the device breaks down. If this voltage is lowered sufficiently, breakdown almost always occurs in the avalanche mode, however, the voltage which the device will hold off (block) may be so low and reverse leakage currents so high as to render the device useless for high voltage applications.

Accordingly, it is an object of the present invention to provide a semiconductor rectifying device using the above described approach to insure breakdown in the bulk rather than over the surface (called controlled avalanche) by raising the magnitude of surface breakdown voltage rather than lowering bulk breakdown voltage.

In copending application Semiconductor Device, Ser. No. 255,037 filed Jan. 30, 1963, in the name of Robert L. Davies and Gerald C. Huth and assigned to the assignee of the present invention, this object is accomplished by contouring the outer periphery of the semiconductor pellet. The proper contours for various pellets are well defined in that application. The general concept is to reduce the concentration of the electric field at the pellet interface and in the region of pellet junctions by using proper geometrical shapes.

The contoured pellet approach proved very satisfactory and provided the first means of producing commercial quantities of devices wherein bulk breakdown was assured. However, some of the pellet contours required to achieve the desired results are difficult to produce and in multijunction pellets, the contour required in region of one junction may tend to increase concentration of the electric field (electric field lines) at the pellet surface and in immediate vicinity of another junction. It is an object of this invention to provide a means of increasing the ability of any pellet (contoured or not) to withstand surface breakdown.

In carrying out the present invention, bulk breakdown in a semiconductor pellet with one or more rectifying junctions is assured by providing a conductive guard electrode a portion of the pellet's periphery. The guard electrode completely encircling is capacitively coupled to the pellet surface, insulated therefrom and provided with the proper shape and potential to reduce electric field concentration in the region of a junction or junctions.

Figure 2:
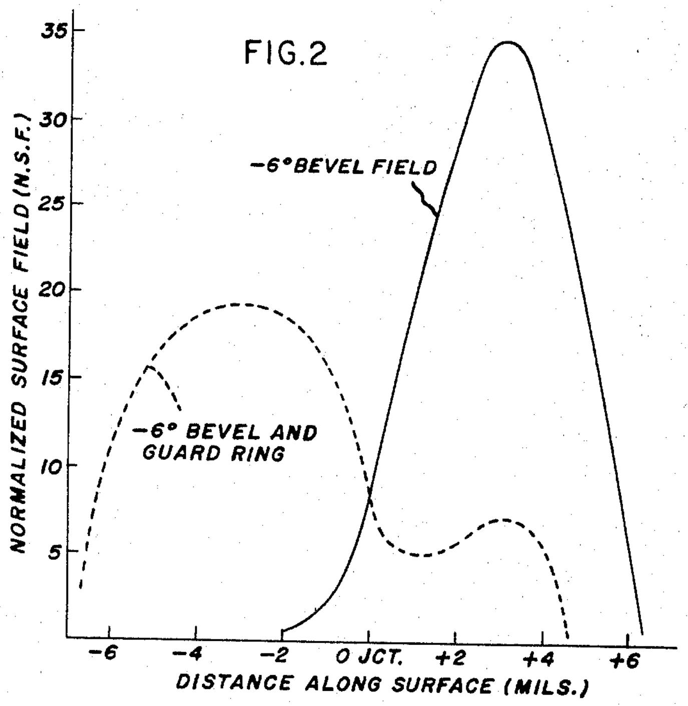
Figure 3:
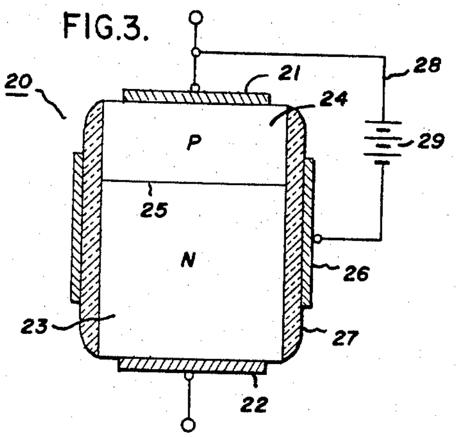
Figure 4:
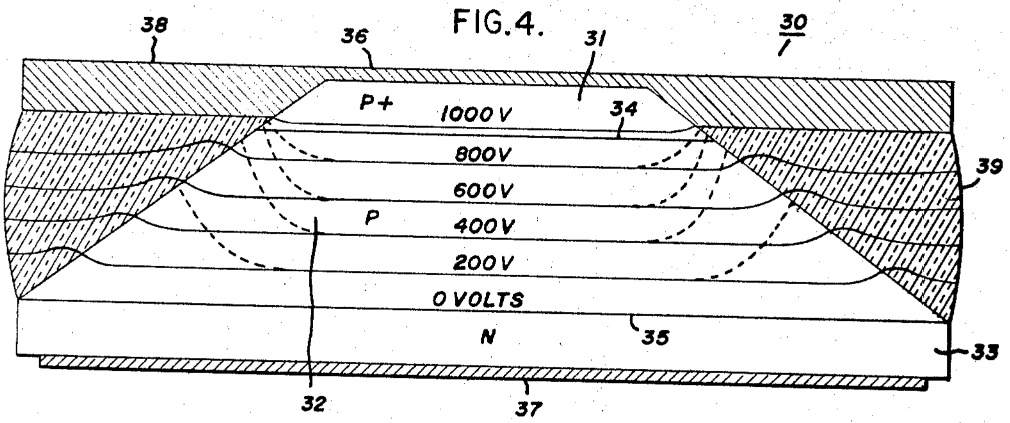
Figure 5:
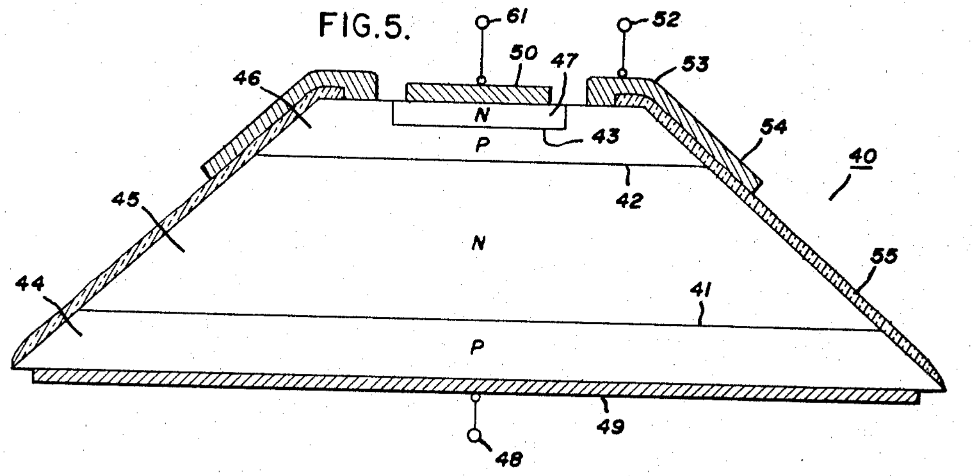

The novel features which are believed to be characteristic of the invention are set forth with particularity in the appended claims. The invention itself, however, both as to its organization and method of operation together with further objects and advantages thereof may best be understood by reference to the following description taken in connection with the accompanying drawings in which:

FIGURES 1, 3 and 4 are central vertical sections through semiconductor rectifier pellets which utilizes teachings of the present invention and which are used to define terms and concepts of the present invention;

FIGURE 2 shows curves taken for the negatively beveled pellet of FIGURE 1 both with and without the guard electrode and illustrating the normalized surface field plotted along the axis of ordinates versus the distance along the peripheral surface; and FIGURE 5 is a central vertical section through a semiconductor pellet used in connection with controlled rectifiers which utilizes techniques of the present invention.

In FIGURE 1, the cross-section of a segment of a pellet 10 of single crystal semiconductive material such as silicon or germanium is depicted in a somewhat diagrammatic fashion. The pellet for many practical semiconductor devices will be circular so that it has the general shape of a round coin but it may have any other shape. In order to have a practical device it is necessary to provide low resistance electrical contacts 11 and 12 (ohmic contacts) on the two major faces of pellet 10. The pellet 10 has two internal regions of different conductivity types; viz, a lower region 13 of N-type conductivity adjacent to the lower major face and a region 14 of P-type conductivity adjacent to the upper major face. The boundary of juncture between the two regions or zones 13 and 14 defines a PN junction 15. The upper P-type zone 14 is marked P+ to indicate that it is highly doped (has a large number of P-type carriers) and therefore is more conductive (has a lower resistivity) than the lower N-type region 13.

In order to establish the exact conductivities for later discussion it will be noted that the pellet 10 shown was a monocrystalline silicon pellet of N-type and having a resistivity of 18 ohm centimeters. The P-type layer was formed by diffusing gallium into the pellet to place the junction depth ($X_j$) at about 3 mils.

The pellet 10 is made bulk limited rather than surface limited by reducing the peak surface electric field in the region of the junction 15 under conditions of reverse bias. Reverse bias occurs when a voltage is applied across the contacts 11 and 12 which is of a polarity which tends to force current across the junction in the non-conducting direction; e.g. negative at the upper contact 11 on the P-type zone relative to the lower contact 12 on the N-type zone. (Note that some small reverse current usually flows across the junction before breakdown but it is so much less than the current which flows in the forward direction it may, for our purposes, be ignored.)

The maximum electric field which exists along the peripheral surface of the pellet 10 is reduced by producing a conductive guard ring or electrode 16 which extends downwardly an equal and uniform distance while completely encircling a portion of the periphery of the pellet and is spaced therefrom by a dielectric material 17 which covers the peripheral surface (edge) of the pellet 10 and the entire periphery of the internal junction. Thus, the electrode 16 is capacitively coupled to the peripheral surface of pellet 10 and is designed to redistribute the electric field along the peripheral surface in such a manner as to reduce the possibility of surface breakdown. As shown here, the guard ring extends over the entire top contact 11 but this is a result of the way the device is made rather than a requirement. Here the pellet is formed by conventional means and the dielectric material 17 (glass) laid down to a thickness of about one-half mil. The guard electrode 16 is then deposited as by a vapor plate deposition process (e.g. with aluminum).

In order to show the efficacy of the guard electrode, the contour used on pellet 10 is one which normally concentrates the electrical field in the area of the junction.

The contour used on the pellet 10 is a simple bevel which reduces the cross-sectional area of pellet 10 going from the lightly doped side of the PN junction 15 (N type zone 13) to the highly doped side (P+ type zone 14). Or stated in another way, the side of highest resistivity has the largest cross-sectional area when considering the cross-sections taken parallel to the junction 15 (or major faces). This type of bevel is defined as a negative bevel as opposed to a positive bevel which is exactly opposite. Another way to consider the reduction is to consider that the reduction in size of the pellet is parallel to the planes of the junction 15 and major faces or perpendicular to the direction of the main charge carrier flow (which, in turn, is perpendicular to the junction 15). At the pellet edge, the carrier flow is not truly perpendicular to the junction but the main flow is. The angle $\theta$ of the bevel for pellet 10 is six degrees (6°) as measured by the acute angle the bevel makes with the planes of the junction 15 and the major faces of the pellet.

The plot of voltage lines (labeled 0, 200 v., 400 v., etc.) show how the electric field (voltage gradient) is spread along the beveled surface. The broken or dashed lines show the potential field for the pellet 10 without the guard electrode and the solid lines show the potential lines for the pellet with guard electrode 16 in place. It is readily seen how the potential lines are spread and hence, the electric field is reduced by addition of guard electrode 16. The general result of lowering the surface field is to cause the sharp avalanche breakdown in the bulk of the material and enhances the capability of the junction to absorb power without destruction.

A better appreciation of the effect of the guard electrode 16 on the surface fields of the pellet 10 of FIGURE 1 may be had by referring to FIGURE 2 where plots of the normalized surface field (in volts per centimeter) are plotted along the axis of ordinates against distance along the surface contour from the junction 15 plotted along the axis of abscissas. The solid line curve is for the pellet 10 with the negative six-degree bevel (so labeled) without the guard electrode 16 and the broken line curve is for the pellet 10 with the guard ring. Considering that the peak electric field for the pellet 10 with no guard electrode 16 is reduced about 15 units and shifted from about 3 mils toward the top contact 11 away from the junction 15 to about 3 mils away from the junction in the higher re-
tivitysis.tiae..
sistivity N type zone 13, the effectiveness of the guard electrode 16 can be seen. Stated in another way, the electric field region is spread a greater distance along the peripheral surface contour from the junction 15 and the peak electric field at the surface is considerably reduced by addition of guard electrode 16. For this device, the normalized surface field N.S.F. (on the graph) is obtained from the following equation:

$$N.S.F.=5\times10^{-15}N_b^{3/4}E_t$$

where $N_b$ is the net impurity concentration in the lightly doped region, $E_t$ is the actual surface field in volts per centimeter.

The field in the dielectric 17 is high at the edge of the guard electrode 16. This field, when supported by a dielectric material does not induce the bad effects that are associated with a high field on a semiconductor surface. Thus, the surface contour (e.g. bevel and bevel angle) may be selected on the basis of other considerations and if surface fields are too high in the area of one or more junctions, they may be reduced by use of a guard electrode. The contoured pellet surface crosses the field lines at an angle (therefore, the field along the pellet surface is small) while the conductive guard electrode constrains the potential field to an essentially planar configuration.

A guard electrode arrangement for a P-N junction pellet 20 with straight (90° bevel) sides is illustrated in FIGURE 3. Again, in order to have a practical device it is necessary to provide low resistance electrical contacts 21 and 22 (ohmic contacts) on the two major faces of pellet 10. The pellet 20 has two internal regions of different conductivity types; viz, a lower region 23 of N-type conductivity adjacent to the lower major face and a region 24 of P-type conductivity adjacent to the upper major face. The boundary of juncture between the two regions or zones 23 and 24 defines a PN junction 25.

Again, the pellet 20 is made bulk limited rather than surface limited by reducing the peak surface electric field in the region of the junction 25 under conditions of reverse bias by the addition of a guard electrode 26. With this arrangement, the guard electrode is made in the shape of an annular ring which conforms to the shape of the periphery of pellet 20. As illustrated, the guard electrode is spaced from the periphery of the pellet by a coating of dielectric material 27 and extends completely around a portion of the periphery between main contacts. Here the major portion of the guard ring 26 is around the lower N type zone 23 although it does extend over the junction.

In order to establish proper potentials between the capacitively coupled guard ring 26 and peripheral surface of the pellet, the ring 26 is electrically connected to upper contact 21 by means of lead 28. If it is desirable to make the ring 26 even more negative under reverse voltage conditions, a separate voltage source, such as battery 29, may be inserted between contact 21 and the ring 26. Or for optimum design ring 26 may be divided into a plurality of rings and different potentials applied to each ring.

The teachings of the present invention as applied to a PIN structure are illustrated in connection with FIGURE 4. In FIGURE 4, the cross-section of a pellet 30 of single crystal semiconductive material such as silicon or germanium is depicted in a somewhat diagrammatic fashion. The pellet illustrated is circular so that it has the general shape of a round coin but it may have any other shape. The pellet 30 illustrated has 3 regions of different resistivities. As illustrated, the upper layer or zone 31 is a highly doped low resistivity region of P type conductivity (labeled P+), an inner zone 32 of high resistivity material and a lower zone 33 of N type material which is highly doped. Thus, there is a central zone 32 of higher resistivity (here shown as P type but it may have intrinsic or N type conductivity) separating two low resistivity zones 31 and 33 of opposite conductivity types; the transitions 34 and 35 from the high resistivity central zone 32 to each of the low resistivity outer zones 31 and 32 respectively may be abrupt and have major portions in the central region of the pellet 10 which are substantially planar. These transitions 34 and 35 are called junctures between layers. A juncture is also considered a junction (rectifying) when the transition is between layers or zones of different conductivity type.

The pellet 30 illustrated is formed by starting with a bulk material (silicon) of P type conductively and impurity concentration $N_b$ of $1.5 \times 10^{14}$ atoms per cubic centimeter and diffusing in a P type impurity (boron) to form the upper P type zone 31 which is 2.5 mils thick and which has a surface impurity concentration $N_S$ of $7 \times 10^{18}$ atoms per cubic centimeter. The lower N type region is diffused in to a depth of 2.5 mils and has a surface impurity concentration of $10^{19}$ atoms per cubic centimeter (phosphorous diffused). The central zone of bulk material is about 2 mils thick. Ohmic contacts (36 and 37) are applied to the upper and lower major faces respectively of the pellet so that a voltage can be applied.

The pellet 30 is provided with a bevel contour which is considered positive since it crosses the junction 35 in such a way that it reduces the cross-sectional area of pellet 30 in a direction parallel to the plane of the junction 34 going from the low resistivity N side of the junction (region 33) to the high resistivity P type side (zone 32). The bevel makes an angle $\theta$ of 8° with the plane of the junction.

It should be noted that this angle is, according to the teachings of the Davies and Huth copending patent application, supra, too small to be used on a high voltage PIN device without special precautions. This is verified by looking at the resultant surface field distribution for the pellet 30 (broken lines labeled 0, 200, 400 volts, etc.) without a guard ring. For this arrangement, the peripheral surface field is redistributed by providing the guard electrode 38 near the peripheral surface but spaced therefrom by a dielectric material 39. In this case, the guard electrode 38 is essentially a planar ring which is made as an integral part of upper contact 36. The guard electrode rearranges the electric field as shown by the solid potential lines. The voltage lines shown in the pellet 30 are for 1000 volts applied between contacts 36 and 37 with the upper terminal 36 negative relative to the lower terminal 37.

The same general principles apply to devices with more layers. For example, in FIGURE 5 a pellet 40 for a silicon controlled rectifier is shown which employs the principles of the present invention. The operation of the silicon controlled rectifier illustrated is not described in detail here since a complete understanding of the operation of the device is not essential to an understanding of the invention and, further, the operation of such devices is discussed in a number of other places which are easily accessible. For example, the operation is described in Chapter 1 of the General Electric Controlled Rectifier Manual, copyright 1960, by the General Electric Company. The part of the device which provides the rectifying and control action is the disc-shaped rectifying semiconductor pellet 40.

The semiconductor pellet 40 is a monocrystalline semiconductor material (silicon in the device illustrated) with three junctions 41, 42 and 43 between four major layers or zones 44, 45, 46 and 47 which are of alternate conduction types. That is, the four layers alternately have an excess of free electrons (N type conduction characteristics) and an excess of positive holes (positive or P type conduction characteristics).

The main conduction path through the rectifier unit is between lower anode terminal 8 and contact 49 through the body of the device and an upper contact 50 and cathode terminal 61. Conduction does not take place in the opposite direction and the conduction which does take place is controlled in accordance with the characteristics of the device by a current (called a gate current) supplied to the rectifier through a gate lead 52 which is connected to the internal P type zone 46 by means of an annular ohmic contact 53. In this embodiment, the surface field reducing guard electrode constitutes an extension 54 of the gate electrode 53. This extension extends down and completely around a portion of the periphery of the pellet 40 and is spaced therefrom by a dielectric layer 55 which covers the pellet edge. Thus, again the guard electrode provided is capacitively coupled to the peripheral surface of the pellet. As will be explained later, it extends over the junction 42 which is most critical (negatively beveled).

The pellet 40 of the device illustrated is formed by taking silicon of N type conduction characteristics (an excess of electrons) and diffusing with an acceptor material (gallium is used for the device illustrated) to form layers of material having positive conduction characteristics on opposite sides of the central layer (zone 45) of N type material. After proper masking, the upper N type emitter zone 47 is diffused in.

The three conduction regions which extend out to the edge of the pellet 40 are each about 3 mils thick and form a PNP structure. The teachings of the copending Davies, Huth patent application, supra, are put to good advantage by applying a single bevel across the three lower regions and thus junctions which forms an angle $\theta$ of six degrees with the planes of the junctions. The bevel reduces the cross-sectional area of the pellet 40 from the bottom toward the top since the central or internal N type region is of higher resistivity than either of the P type regions which it separates the bevel is positive for the lower junction and negative relative to the next junction (between the internal N and P regions). This angle is optimum for the negatively beveled junction and quite good for the positively beveled junction. The ability of the negatively beveled junction to withstand reverse voltage without surface breakdown is further enhanced by the addition of the guard electrode 53 as explained in connection with the negatively beveled pellet 10 of FIGURE 1.

While particular embodiments of the invention have been shown and described, it will, of course, be understood that the invention is not limited thereto since many modifications varied to fit particular operating requirements and environments will be apparent to those skilled in the art. The invention may be used to perform similar functions and its peculiar properties taken advantage of in semiconductor devices utilizing other materials than those described and such devices formed in other ways without departing from the concept of the invention. Accordingly, the invention is not considered limited to the example chosen for the purposes of disclosure and it is contemplated that the appended claims will cover any such modifications as fall within the true spirit and scope of the invention.

What I claim as new and desire to secure by Letters Patent of the United States is:

1. A semiconductor device including a pellet of semiconductor material having general parallel major faces connected by an annular side wall relative to said major faces and having at least one internal junction between two zones of different conduction characteristics and parallel to the top major face of said pellet, said internal junction intersecting the peripheral side wall of said pellet, electrodes on said major faces of said pellet between which voltages may be impressed to form a resultant space charge layer in the region of the junction and an electric field in the region of the space charge layer, means to reduce the peak electric field in the region of said junction at the periphery of said pellet by changing the distribution of the electric field within the space charge layer at said side wall of said pellet, said means including a guard electrode extending downward from said top major face for an equal distance and covering at least a portion of the thickness of said space charge layer throughout the entire periphery of said space charge layer, and a layer of material of high dielectric strength separating said guard electrode from said pellet and completely covering at least the entire periphery of said internal junction.

2. A semiconductor device including a pellet of semiconductor material having at least one junction between two zones of different conduction characteristics and resistivities, said junction intersecting the peripheral sides of said pellet, said semiconductor pellet having a cross-sectional area which diminishes perpendicularly to the direction of the main charge carrier flow along a semiconducting zone within the region of space charge zone forming in the presence of operating current conducted thereto, said diminution resulting in a smaller cross-sectional area on the side of lower resistivity, means to increase the reverse voltage withholding capability of said pellet by spreading the electric field in the region of the space charge zone at the peripheral surface of the semiconductor material, said means including a guard electrode extending downward from the top surface of said pellet for an equal distance and covering the entire thickness of said space charge layer throughout the entire periphery of said space charge layer, and a layer of material of high dielectric strength separating said guard electrode from said pellet and completely covering at least the entire periphery of said internal junction.

3. In a semiconductor device, a pellet of semiconductor material having at least two regions of different conductivity types and resistivities defining a junction therebetween, the surface of said pellet having a bevel around its periphery and intersecting said junction whereby the cross-sectional area of said pellet diminishes perpendicularly to the direction of charge carrier flow along a semi-conducting zone within the region of space charge zone forming in the presence of operating current conducted thereto, said bevel resulting in a smaller cross-sectional area on the side of said junction which is of lower restivitiy, means to increase the reverse voltage withholding capability of said pellet by spreading the electric field within the space charge layer at the surface of the semiconductor material, said means including a guard electrode extending downward from the top surface of said pellet for an equal distance and covering the entire thickness of said space charge layer throughout the entire periphery of said space charge layer, and a layer of material of high dielectric strength separating said guard electrode from said pellet and completely covering at least the entire periphery of said internal junction.

4. In a semiconductor device, a body of semiconductor material having at least two regions of opposite conductivity type separated by and contiguous with a separating region of higher resistivity whereby a depletion region is formed in the separating region of higher resistivity and an electric field is formed at the pellet surface when a voltage is applied which is of a polarity to tend to force current through said body in a normally non-conducting direction, said body having its surface beveled to form an acute angle with a plane of the said depletion region of between two and ninety degrees, means to reduce the peak electric field at the surface of said pellet and increase the reverse voltage withholding capability of said pellet, said means including a guard electrode extending downward from the top surface of said pellet for an equal distance and covering at least a portion of the thickness of said depletion region throughout the entire periphery of said depletion region, and a layer of material of high dielectric strength separating said guard electrode from said pellet and completely covering at least the entire periphery of said depletion region.

5. A semiconductor rectifying device including in combination electrical contact means and a pellet of semiconductor material having two essentially parallel major faces, said pellet having its major faces connected between said electrical contact means whereby a voltage may be applied across the said major faces, said pellet having at least two regions of relatively highly doped material separated by and contiguous with a separating region of higher resistivity than either of said two regions whereby junctures are defined between said regions which are essentially parallel to the said major faces, at least one of said junctures forming a rectifying junction, the surface of said body contoured in the area of said junction in such a manner that the cross-sectional area of said pellet diminishes in a direction parallel to the plane of said junctures and in a manner to form an acute angle with said planes between two and ninety degrees with the region adjacent said junction of lowest resistivity having the smallest cross-sectional area, means to increase the reverse voltage withholding capability of said pellet by reducing the peak electric field formed in the region of the said junction upon application of the reverse voltage, said means including a guard electrode extending downward from the top major face of said pellet for an equal distance and covering at least the entire periphery of said junction, and a layer of material of high dielectric strength separating said guard electrode from said pellet and completely covering at least the entire periphery of said junction.

6. In a controlled rectifier device, a pair of electrical contacts, a semiconductor body including first and second zones of one conductivity type separated by and contiguous with a third zone of opposite conductivity type defining two substantially parallel junctions between said zones and a fourth zone of said opposite type conduction characteristics set in said first zone inwardly from the outer periphery of said body and defining a third junction in said body substantially parallel with said first two junctions, said pair of contacts ohmically connected to said second and fourth zones whereby a potential can be applied between said zones, means to increase the reverse voltage withholding capability of said pellet, and means including a guard electrode extending downward from the top surface of said pellet for an equal distance and encircling at least a portion of the surface of said pellet, said guard electrode having a portion in ohmic contact with said first zone whereby its potential can be determined relative to the potential of said second and fourth zones, and a layer of material of high dielectric strength separating said guard electrode from said pellet.

7. A rectifier device as defined in claim 6 wherein said body has a contoured periphery, said contour being such that the planes of said first two junctions are not coextensive and the area of said body diminishes in a direction parallel to the said planes and from said second zone toward said first zone.

8. A semiconductor rectifying device including in combination electrical contact means and a pellet of semiconductor material having two essentially parallel major faces, said pellet having its major faces connected between said electrical contact means whereby a voltage may be applied across the said major face, said pellet having at least two regions of relatively highly doped material separated by and contiguous with a separating region of higher resistivity than either of said two regions whereby junctures are defined between said regions which are essentially parallel to the said major faces, at least one of said junctures forming a rectifying junction, the surface of said body contoured in the area of said junction in such a manner that the cross-sectional area of said pellet diminishes in a direction parallel to the plane of said junctures and in a manner to form an acute angle with said planes between two and ninety degrees with the region adjacent said junction of lowest resistivity having the lrgest cross-sectional area, means to increase the reverse voltage withholding capability of said pellet by reducing the peak electric field at the surface which forms in the presence of reverse voltage, said means including a guard electrode extending downward from the top major face of said pellet for an equal distance and covering at least a portion of the periphery of said pellet, and a layer of material of high dielectric strength separating said guard electrode from said pellet.

(References on following page)

References Cited

UNITED STATES PATENTS

| | | | |
|---|---|---|---|
| 2,879,190 | 3/1959 | Logan et al. | |
| 2,890,395 | 6/1959 | Lathrop et al. | 317—234 |
| 2,962,605 | 11/1960 | Grosvalet. | |
| 2,989,650 | 6/1961 | Doucette et al. | 317—234 |
| 3,065,391 | 11/1962 | Hall | 317—234 |
| 3,179,860 | 4/1965 | Clark et al. | 317—234 |
| 3,200,310 | 8/1965 | Carman | 317—234 |
| 3,200,311 | 8/1965 | Thomas et al. | 317—234 |
| 3,212,162 | 10/1965 | Moore | 29—253 |
| 3,287,612 | 11/1966 | Lepselter. | 317—235 |
| 3,290,127 | 12/1966 | Dawon Kahng et al. | 29—195 |
| 3,302,076 | 1/1967 | Ki Dong Kang et al. | 317—234 |

| | | | |
|---|---|---|---|
| 3,292,057 | 12/1966 | Touchy | 317—234 |
| 3,325,702 | 6/1967 | Cunningham | 317—234 |

FOREIGN PATENTS

| | | |
|---|---|---|
| 1,361,215 | 4/1964 | France. |
| 998,388 | 7/1965 | Great Britain. |

OTHER REFERENCES

"Effect of Variations in Surface Potential on Junction Characteristics," by J. H. Forster and H. S. Veloric, Publisher in the Journal of Applied Physics, vol. 30, No. 6, June 1959, pp. 906 to 912.

JOHN W. HUCKERT, *Primary Examiner.*

R. SANDLER, *Assistant Examiner.*